United States Patent [19]
Levy

[11] Patent Number: 4,943,325
[45] Date of Patent: Jul. 24, 1990

[54] REFLECTOR ASSEMBLY

[75] Inventor: Sheldon L. Levy, Prairie Village, Kans.

[73] Assignee: Black & Veatch, Engineers-Architects, Kansas City, Mo.

[21] Appl. No.: 260,231

[22] Filed: Oct. 19, 1988

[51] Int. Cl.$^5$ ............................................. H01L 31/04
[52] U.S. Cl. ........................................ 136/259; 126/438; 126/439; 136/246; 350/612; 350/613
[58] Field of Search ................ 136/246, 259; 126/438, 126/439; 350/612, 613

[56] References Cited
U.S. PATENT DOCUMENTS

| | | | |
|---|---|---|---|
| 2,904,612 | 9/1959 | Regnier | 136/246 |
| 3,071,667 | 1/1963 | Lee | 200/144 R |
| 3,392,304 | 7/1968 | Anderson | 315/14 |
| 3,400,207 | 9/1968 | Anderson | 373/12 |
| 3,544,913 | 12/1970 | Anderson | 328/267 |
| 3,546,606 | 12/1970 | Anderson | 328/267 |
| 3,609,200 | 9/1971 | Anderson | 373/12 |
| 3,748,536 | 7/1973 | Andresen | 361/57 |
| 3,783,231 | 1/1974 | Sablev et al. | 219/123 |
| 3,793,179 | 2/1974 | Sablev et al. | 204/298 |
| 3,839,182 | 10/1974 | Sager | 204/298 |
| 4,162,174 | 7/1979 | Kaplow et al. | 136/246 |
| 4,242,580 | 12/1980 | Kaplow et al. | 250/203 R |
| 4,388,481 | 6/1983 | Uroshevich | 136/246 |
| 4,448,659 | 5/1984 | Morrison, Jr. | 204/192.38 |
| 4,448,799 | 5/1984 | Bergman et al. | 427/37 |
| 4,559,125 | 12/1985 | Mularie | 204/298 |
| 4,620,913 | 11/1986 | Bergman | 204/192.1 |

FOREIGN PATENT DOCUMENTS

3121389A1 8/1987 Fed. Rep. of Germany ...... 201/298 PS
63-53263 3/1988 Japan ............................ 204/298 PS

OTHER PUBLICATIONS

"The MDX As A Strategic Tool In Reducing Arcing," D. S. Schatz, Advanced Energy Industries, Inc. (1983).
"Arcing Problems Encountered During Sputter Deposition of Aluminum," T. C. Grove, Advanced Energy Industries, Inc. (1986).
Press Release, Jan. 14, 1988, Advanced Energy Industries, Inc.
Product Brochure entitled "MDX-10K Series DC Magnetron Drives", Advanced Energy Industries, Inc. (Jan. 14, 1988).
S. L. Levy, Black & Veatch, Engineers-Architects; Conceptual Design for a High-Concentration (500X) Photovoltaic Array; Dec., 1984, EPRI AP-3263 Project 1415-7.
S. L. Levy and L. E. Stoddaryd, Black & Veatch, Engineers-Architects; High-Concentration Photovoltaic Module Design; Aug., 1986, EPRI AP-4752, Project 1415-7.

Primary Examiner—Aaron Weisstuch
Attorney, Agent, or Firm—Litman, McMahon & Brown

[57] ABSTRACT

A reflector assembly for a solar energy system including a circular dish-shaped concentrator which may be oriented towards the sun. The concentrator provides a conical flux concentration with a circular, cross-sectional image. A photovoltaic receiver with a square surface is positioned partly within the flux concentration. The reflector assembly includes reflector elements for redirecting concentrated flux from marginal portions of the flux concentration image to corner portions of the receiver surface.

20 Claims, 3 Drawing Sheets

4,943,325

REFLECTOR ASSEMBLY

BACKGROUND OF THE INVENTION

1. Field of the Invention.

The present invention relates generally to optical reflectors, more particularly to optical reflectors for solar energy systems, and specifically to a reflector assembly comprising a secondary optical element (SOE) for matching concentrated solar insolation forming a circular image to a square, photovoltaic receiver.

2. Description of the Related Art.

Solar insolation has several important advantages as an energy source. Unlike fossil fuels, it is renewable indefinitely. It is also regarded as "free" energy, as distinguished from fossil and nuclear fuels which are commonly sold for energy use. Solar energy has the further advantage of avoiding most of the environmental and toxic waste problems associated with energy production from fossil and nuclear fuels.

Most parts of the world receive far more solar energy than is required to meet local energy demands. However, effective utilization of the available solar insolation often requires converting it to a different energy form, such as thermal or electrical. Furthermore, since neither the availability of solar energy nor the general demand for energy are constant, for some applications it is desirable to convert solar energy to a form of energy that can be stored.

Photovoltaic energy systems convert light energy, e.g. solar insolation, to electrical energy. Semiconductors are commonly used to construct photovoltaic cells, which may be grouped in modules of cell matrices to provide a desired level of electrical power output. A photovoltaic receiver may comprise a number of individual photovoltaic cells, which are linked in both series and parallel combinations or circuit branches.

Photovoltaic systems can operate on direct solar insolation. However, because the photovoltaic collectors tend to be relatively expensive, it is sometimes more cost effective to concentrate the solar insolation which impinges upon the photovoltaic collector.

For example, photovoltaic systems have been designed with relatively high concentrations of five hundred times the ambient solar insolation level. Various types of reflective and refractive concentrators have heretofore been devised, including central receiver concentrating solar systems, dish concentrating solar systems, line focus concentrating solar systems and smaller lens point focus concentrating solar systems. A relatively cost effective concentrator may be designed with a flexible membrane formed in a dish-shaped configuration with an axis which is directed at the sun. The resulting flux concentration is cone-shaped, and the receiver may intercept the conical flux concentration on either side of its focal point, with the receiver surface preferably lying in a plane substantially normal to the axis.

However, the concentrated light image provided by a typical dish-shaped concentrator is circular in planform, whereas the optimum receiving surface planform for many photovoltaic receivers is square. Thus, photovoltaic energy system designers have been confronted with the problem of matching a square-surfaced photovoltaic receiver with a circular, concentrated light image. The receiver could be oversized to receive practically all of the concentrated light, but the corners of the receiver would then receive little or no concentrated light.

Photovoltaic cell operating efficiency is generally related to the illumination of the cell and the electrical current therethrough. A circuit branch of series-linked photovoltaic cells generally operates only as efficiently as the individual cell receiving the least amount of illumination. Hence a cell which does not receive adequate illumination can affect the performance of all other cells in series with it. Since the voltage output of the individual photovoltaic cells is often fairly low, photovoltaic receivers commonly include circuit branches of individual cells linked in series to provide a desired output voltage level. Therefore, optimum operating efficiency and cost effectiveness is generally achieved by providing substantially uniform flux density over the entire receiver surface.

Uniform flux density on the receiver surface could be achieved by oversizing the collector so that the receiver surface fits completely within its image. However, a problem with this solution is that a substantial amount of concentrated flux may miss the receiver completely because the flux concentration image would necessarily have a greater area than the receiver surface. Such an energy system would therefore have a lower operating efficiency corresponding to its concentrated flux losses.

Secondary optical elements (SOE's) have heretofore been proposed for improving the level of uniform flux density and improving the utilization of the concentrated flux. Such previous SOE's had various configurations, including circular, prismatic and pyramidal. Some previous SOE's had refractive optical elements, and others had reflective optical elements. Although these previous SOE's were capable of providing some degree of improvement in system efficiency, none had the advantages and features of the present invention.

SUMMARY OF THE INVENTION

In the practice of the present invention, a reflector assembly is provided for a solar energy system including a dish-shaped concentrator or collector and a photovoltaic receiver. The concentrator includes a longitudinal axis which is oriented towards the sun for providing a coneshaped flux concentration with a circular, cross-sectional image. A photovoltaic receiver with a square surface is positioned partly within the flux concentration. The reflector assembly includes pairs of reflector elements which are positioned within marginal portions of the flux concentration that would otherwise miss the square receiver surface. The reflector elements redirect the concentrated photons or light rays to corner portions of the receiver surface that lie outside the flux concentration image. The areas of the flux concentration image and the reflector surface may be established with respect to each other whereby substantially uniform flux density is achieved over the entire reflector surface. To achieve such uniform flux density, the area of the flux concentration image may be somewhat larger than the area of the reflector surface to compensate for reflectivity and other losses associated with the reflector elements.

ADVANTAGES AND OBJECTS OF THE INVENTION

The principal advantages and objects of the present invention include: providing a reflector assembly; providing such a reflector assembly for use in a solar energy system; providing such a reflector assembly for providing a photovoltaic receiver with substantially uniform flux density; providing such a reflector assembly for effectively utilizing a flux concentration from a dish-shaped concentrator; providing such a reflector assembly for redirecting concentrated flux to specific areas on a photovoltaic receiver surface; providing such a reflector assembly which facilitates efficient and cost effective operation of a photovoltaic solar energy system; and to provide such a reflector assembly which is economical to manufacture, efficient in operation, capable of a long operating life and particularly well adapted for the proposed usage thereof.

Other objects and advantages of this invention will become apparent from the following description taken in conjunction with the accompanying drawings wherein are set forth, by way of illustration and example, certain embodiments of this invention.

The drawings constitute a part of this specification and include exemplary embodiments of the present invention and illustrate various objects and features thereof.

Detailed Description of the Preferred Embodiments

Figure 1:
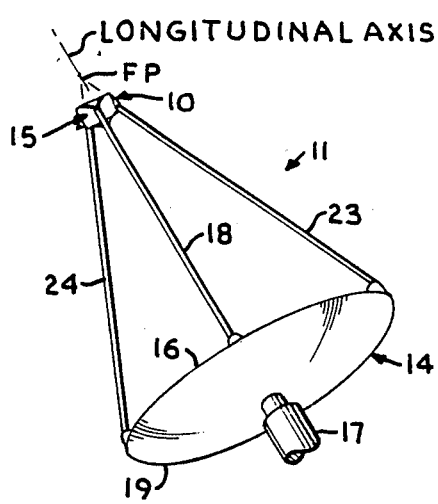
FIG. 1 is a perspective view of a solar energy system with a reflector assembly embodying the present invention.
Figure 2:
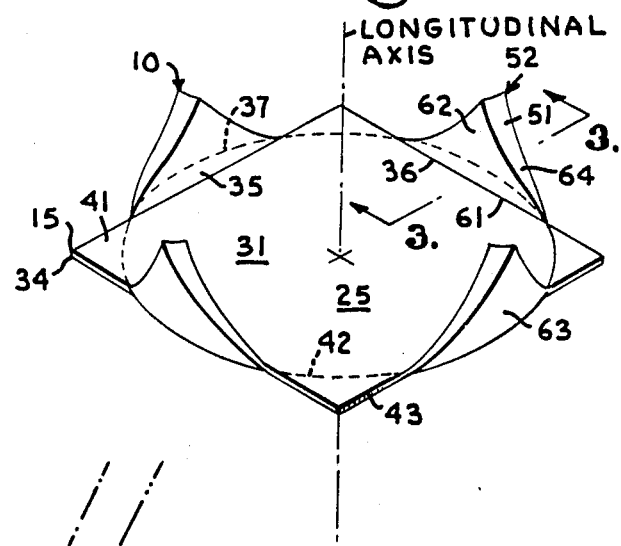
FIG. 2 is an enlarged perspective view of the reflector assembly and a photovoltaic receiver.
Figure 3:
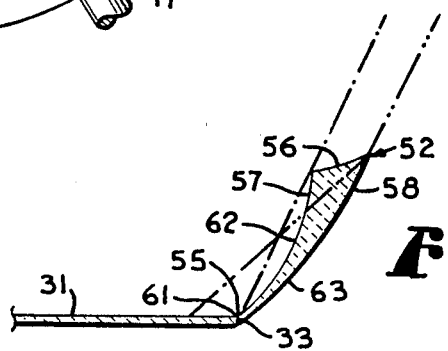
FIG. 3 is an enlarged, fragmentary, cross-sectional view of the reflector assembly and the receiver taken generally along line 3—3 in FIG. 2.

As required, detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

Referring to the drawings in more detail, the reference numeral 10 generally designates a reflector assembly embodying the present invention. Without limitation on the generality of useful applications of the present invention, the reflector assembly 10 is shown and described as part of a solar energy system 11. The energy system 11 generally comprises a dish-shaped concentrator or collector 14, a photovoltaic receiver 15 and the reflector assembly 10. Since the concentrator 14 may be considered a primary reflector of the energy system 11, the reflector assembly 10 may be referred to as a secondary optical element (SOE).

The concentrator 14 has a generally dish-shaped, concave, parabolic configuration with a longitudinal axis and a circular planform. The concentrator 14 includes a circular rim 16 lying in a plane substantially perpendicular to the longitudinal axis.

The concentrator 14 may comprise, for example, a flexible, reflective membrane 19 with a concave reflective surface (not shown). The concentrator 14 may be mounted on a suitable mounting structure 17, which may be adapted for tracking the sun so that the longitudinal axis aligns with the sun when the energy system 11 is in operation. Photons or rays, for example solar insolation, strike the membrane reflective surface (not shown) and, if the concentrator 14 is properly oriented, they converge at a focal point FP on the longitudinal axis. The maximum flux concentration of light or energy may be expected at the focal point FP.

When the concentrator 14 is properly oriented, it provides a flux concentration 23 which is substantially conical, with the concentrator rim 16 lying in a plane defining the base of the cone and the focal point FP forming the apex. Between the focal point FP and the concentrator rim 16 a conical flux concentration periphery 24 is defined. The flux concentration periphery 24 may be defined as sharply as is permitted by the material comprising the membrane 19. Factors such as the effects of the atmosphere, imperfections in the shape of the membrane 19, discrepancies in tracking the position of the sun, the sun diameter, limb darkening, etc. may all affect the configuration of the flux concentration 23 and the energy intensity at its periphery 24. For purposes of describing an example of the invention, the flux concentration 23 will be referred to as generally conical, but it will be appreciated that in practice the flux concentration periphery 24 will define a more gradual transition between the light or energy levels or flux density within and without the flux concentration 23.

The receiver 15 may be adapted to convert the concentrated insolation to another energy form, such as electrical energy. The receiver 15 may be mounted on the longitudinal axis by mounting rods 18 connected to the concentrator 14. The receiver 15 may therefore comprise, for example, an array of photovoltaic modules with a lightadmitting receiver surface 31.

The receiver surface 31 has a substantially square or rectangular, planar configuration and is substantially perpendicular to and centered upon the longitudinal axis. The receiver surface 31 includes four sides 33 of substantially equal length which intersect at and define respective corners 34. The receiver surface 31 is shown in FIG. 1 between the concentrator 14 and the focal point FP. Alternatively, the receiver 15 can be located on the other side of the focal point FP, i.e. with the focal point FP between the concentrator 14 and the receiver 15.

Figure 4:
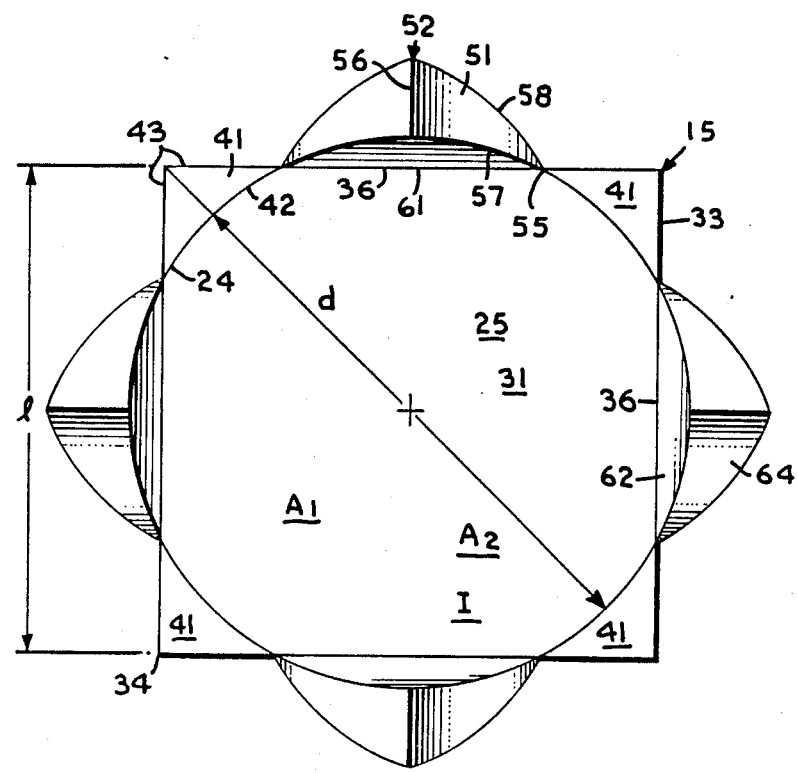
FIG. 4 is an enlarged, top plan view of the reflector assembly and the receiver.

At an intersection area I of the flux concentration 23 (FIG. 1) and the receiver surface 31, the flux concentration 23 comprises a circular image 25 with an area A1 slightly larger than a square area A2 occupied by the receiver surface 31. Thus, at the plane of intersection the image 35 of the flux concentration 23 has a diameter (d) which is greater than a length (l) of a respective receiver surface side 33. The circular flux concentration image 25 overlaps the square receiver surface 31 at the intersection area I, and the flux concentration image 25 includes image marginal portions 35 which protrude beyond the receiver surface sides 33 and have substantially straight, inner margins or chords 36 colinear with the receiver surface sides 33 and arcuate, outer margins 37 which intersect the receiver surface sides 33 at points 0. As can be observed in FIG. 4, without the reflector assembly 10, insolation falling in the image marginal portions 35 would miss the receiver 15.

The receiver surface 31 includes corner portions 41 between the light concentration marginal portions 35. The corner portions 41 are defined by arcuate, inner margins 42 and by outer margins 43 extending from points 0 along respective receiver surface sides 33 to the corners 34.

The design of the photovoltaic modules (not shown) for the receiver 15 may require or at least make preferable a substantially rectilinear or square configuration for the receiver surface 31. The most practical configuration for the concentrator 14, on the other hand, may be circular in planform for producing a circular image 25. The preferred configurations for the concentrator 14 and the receiver 15 may be affected by manufacturing and installation considerations. Efficiency considerations, on the other hand, might suggest that either the light concentration image 25 have a square configuration to match that of the receiver surface 31, or that the receiver surface 31 be circular to match the image 25; either way more of the concentrated flux from the concentrator 14 would be received by the receiver 15 for useful application.

The circular planform configuration of the image 25 and the square planform configuration of the receiver 31, together with their respective dimensions, form the image marginal portions 35 and the receiver surface corner portions 41. Without the reflector assembly 10, substantial amounts of concentrated insolation would pass through the image marginal portions 35, and the receiver surface corner portions 41 would receive little or no insolation.

The reflector assembly 10 comprises a plurality (eight are shown) of individual reflector elements 51 grouped in pairs on the receiver surface sides 33, each pair of reflector elements 51 forming a reflector subassembly 52. The reflector elements 51 of each subassembly 52 converge in a direction towards the concentrator 14. Each reflector element 51 has a proximate end 55 which intersects a receiver surface side 33 at a respective point 0 and a distal end 56 in spaced relation between the concentrator 14 and the receiver surface 31. Each reflector element 51 is also bounded by inner and outer margins, 57, 58 extending between the ends 55, 56. The outer margins 58 lie on the flux concentration periphery 24.

Each reflector subassembly 52 includes a baseline 61 extending between the reflector element proximate ends 55 (i.e., points 0) along a respective receiver surface side 33. The reflector subassemblies 52 include inner and outer faces 62, 63 bounded by respective margins 57, 58 and by the baseline 61.

Figure 5:
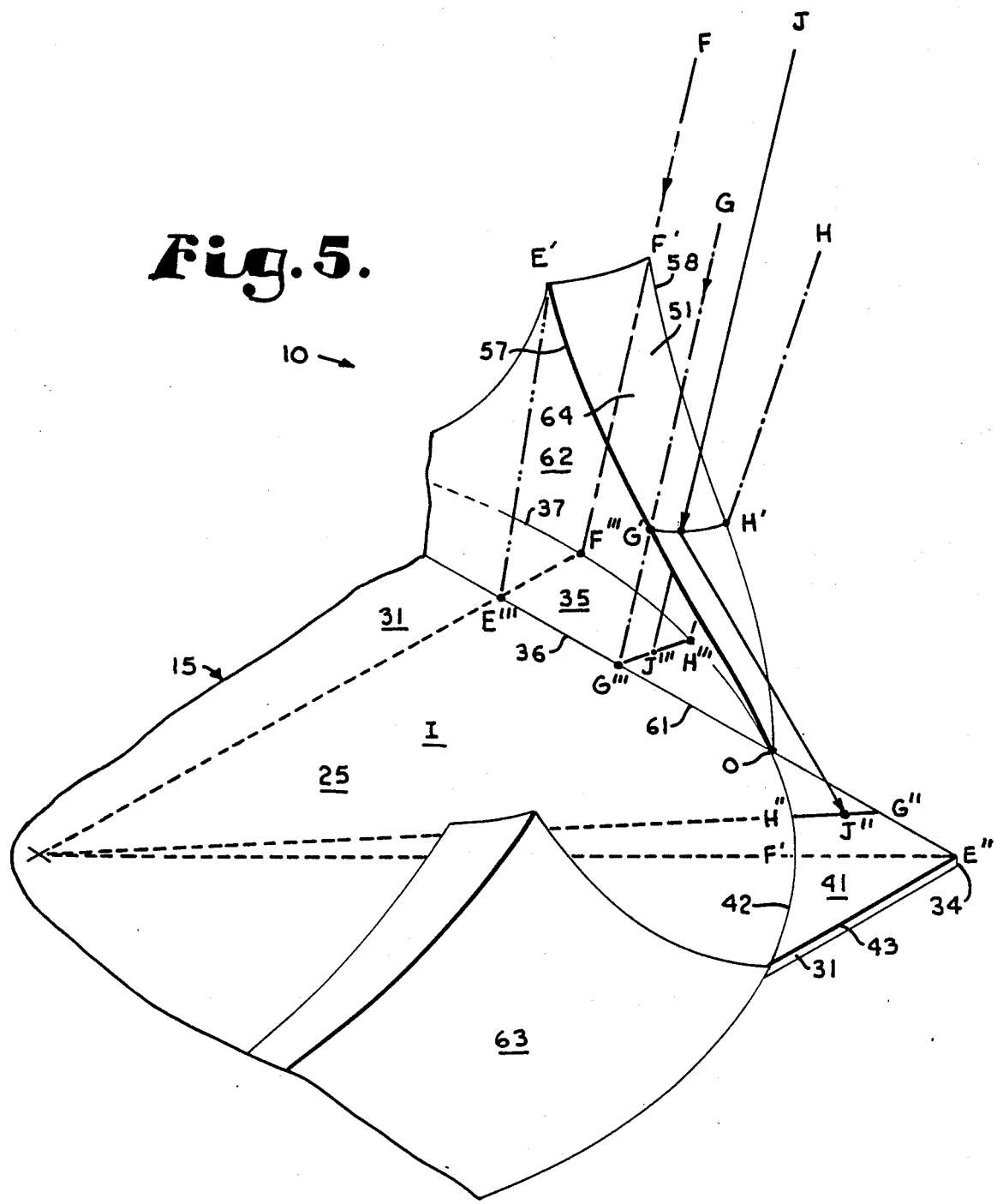
FIG. 5 is a fragmentary, perspective view of the reflector assembly and the receiver, particularly showing the redirection by the reflector assembly of light rays from the concentrator to corner portions of the receiver.

Each reflector element 51 includes a reflective surface 64 bounded by respective inner and outer margins 57, 58 and by a respective distal end 56. Between the reflector subassembly faces 62, 63, the reflector subassembly distal ends 56 are curved in a direction away from the concentrator 14 (FIG. 5). This curvature extends along the entire lengths of the reflector elements 51 whereby their reflective surfaces 64 are actually bicurved and concave in two directions: 1) longitudinally between their ends 55, 56; and 2) transversely between their margins 57, 58. The reflective surfaces 64 of the reflector elements 51 may comprise a variety of reflective materials, for example, silvered glass, anodized aluminum, etc.

The reflector elements 51 are positioned to reflect most of the concentrated insolation that would otherwise pass by the receiver lens 31 through the marginal portions 35 of the flux concentration 23. The double-concave bicurvatures of the reflector elements 51 are designed to deflect the insolation to the receiver surface corner portions 41 in such a manner that substantially uniform flux density is achieved on the corner portions 41 and the rest of the receiver surface 31, which contributes to the efficient operation of the photovoltaic receiver 15.

As an example of the manner in which photons or rays are reflected by the reflector assembly 10, the photon impact points for rays or ray traces E, F, G, H and J from the concentrator 14 are shown in FIG. 5. Rays E and F strike the reflector element 51 in proximity to its distal end 56 at points E' and F'. E' is located adjacent to the reflector subassembly inner margin 57 and F' is located adjacent to the reflector subassembly outer margin 58. The reflected rays E and F cross each other and strike the receiver surface 31 at points E'' and F'' in the receiver surface corner portion 41. Point E'' is located adjacent to a corner 34 and point F'' is located adjacent to the corner portion inner margin 42. If the reflector assembly 10 were not present, the rays E and F would pass through points E''' and F''' in the image marginal portion 35, and thus represent lost energy.

Each reflector element 51 reflects insolation that would otherwise pass through approximately half of a marginal portion 35 to half of a respective corner portion 41, i.e. from the reflector element 51 areas bounded by points 0, E' and F' to the receiver surface 31 areas bounded by points 0, E'' and F''.

In operation, the reflector assembly 10 thus enhances the performance of the solar energy system 11 by providing a more uniform flux density on the receiver surface 31 and by providing a more effective utilization of the flux concentration 23. In an idealized system, substantially uniform flux density could be provided over the entire receiver surface 31 by equalizing the areas of the image marginal portions 35 and the receiver surface corner portions 41. However, in practice some or all of the following factors may reduce the effectiveness of the reflector assembly 10: (1) lower flux density at the flux concentration periphery 24; (2) reflectivity losses associated with the reflector elements 51; (3) slope errors of the reflector element reflective surfaces 64; (4) reflective losses associated with the receiver surface 31; (5) orientation and tracking errors associated with the concentrator 14; (6) losses associated with matching the circular configuration of the flux concentration image 25 with the square configuration of the receiver surface 31; and (7) flux intensity cosine losses associated with the concentrator 14. Thus, in actual practice the reflector assembly 10 would be expected to improve the efficiency and output of the energy system 10, but would not be expected to provided perfectly uniform flux density over the entire receiver surface 31.

The reflector elements 51 are shown with bicurvatures, i.e. longitudinally and transversely concave. However, they could also have single curvatures (longitudinal or transverse, concave or convex) and further could be flat. Still further, the reflector elements 51 could comprise mosaics of individual strips or pieces of reflective material, for example, mirror tiles. The configuration of the reflective surfaces 64 of the reflector elements 51 can be designed to provide a desired level of flux density in the receiver surface corner portions 41, which may be substantially equal to a flux density over the rest of the receiver surface 31. Individual pieces or strips of reflective material comprising the reflector elements 51 can be empirically oriented to reflect light rays or photons to desired target areas of the receiver surface corner portions 41 to attain a desired flux density distribution. Yet another factor that may influence the configuration of the reflective surfaces 64 of the reflector elements 51 is the correlation between light reflection efficiencies and incidence angles which is a characteristic of a material comprising the reflective surfaces 64.

Figure 6:
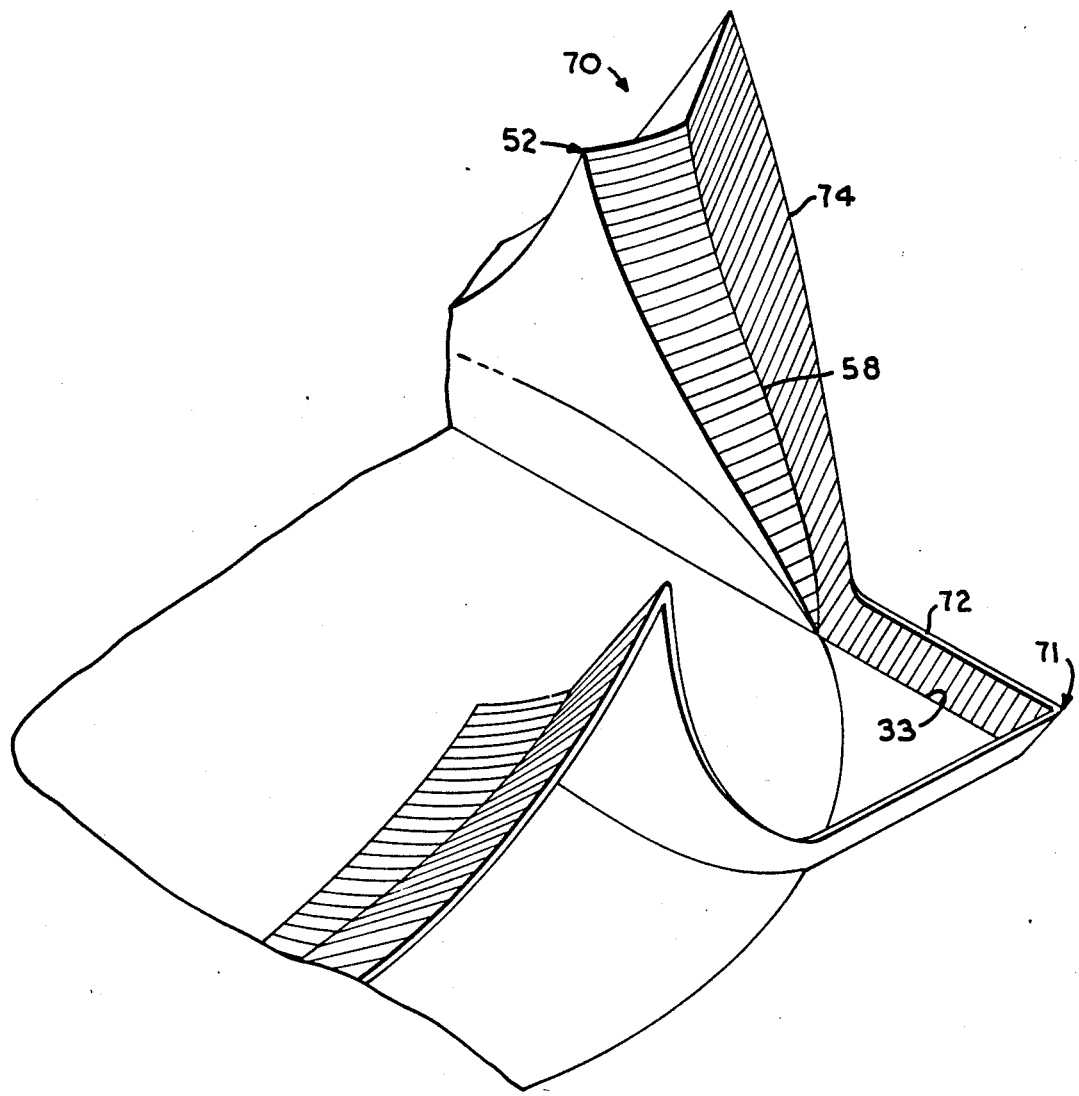
FIG. 6 is an enlarged, fragmentary, perspective view of a reflector assembly comprising a modified embodiment of the present invention with auxiliary reflector elements for redirecting stray edge flux to portions of a photovoltaic receiver.

A reflector assembly 70 comprising a modified embodiment of the present invention is shown in FIG. 6 and includes the reflector subassemblies 52 described above and an extension reflector subassembly 71. The extension reflector subassembly 71 includes corner extension reflectors 72 each sloping away from a respective receiver surface side 33. Reflector element extensions 74 extend generally outwardly from the reflector subassembly outer margins 58. The extension reflector subassembly 71 is adapted to capture slightly concentrated light adjacent to and just outside of the flux concentration periphery 24. This rereflected supplemental light supplements the light reflected to the receiver surface 31.

It is to be understood that while certain forms of the present invention have been illustrated and described herein, it is not to be limited to the specific forms or arrangement of parts described and shown.

What is claimed is:

1. In combination with a primary light concentration having an axis and providing a light concentration and a generally planar receiver including a first portion located directly with in said light concentration and a second portion located outside of said direct light concentration, the improvement of a secondary reflector which comprises:
   (a) reflector means positioned within said light concentration and oriented to deflect a portion of said light concentration outwardly to the second portion of said receiver outside of said direct light concentration, whereby said portions of said receiver both within and outside of said direct light concentration are illuminated.

2. The combination according to claim 1, wherein the secondary reflector means includes:
   a proximate end, and
   a distal end,
   said distal end being located closer to the primary light concentrator than said proximate end; and
   said secondary reflector means having a tapered configuration with said distal end being wider than said proximate end.

3. The combination according to claim 1, wherein: said secondary reflector means comprises at least one pair of reflector elements converging in a direction generally towards the primary light concentrator.

4. The combination according to claim 3 wherein: said reflector elements have longitudinally curved configurations.

5. The combination according to claim 1, which includes:
   a generally planar receiver substantially perpendicular to the axis of said primary light concentrator; and
   the deflected portion of the light concentration has generally straight outer boundaries and a curved inner boundary.

6. The combination according to claim 5 wherein: said receiver is substantially square in planform.

7. The combination according to claim 6 wherein: said receiver has an area substantially equal to a circular cross-sectional area of said light concentration where said receiver intersects said light concentration.

8. The combination according to claim 1 wherein: said secondary reflector means comprises anodized aluminum.

9. The combination according to claim 1 wherein: said secondary reflector means comprises silvered glass.

10. A solar energy system, which comprises:
    (a) a dish-shaped concentrator having a longitudinal axis of symetry, a circular planform in a plane substantially perpendicular to the longitudinal axis and a concave reflective surface;
    (b) said concentrator being adapted to provide a generally conical flux concentration with a focal point on said longitudinal axis, said light concentration having a generally circular cross-sectional configuration taken generally on a plane perpendicular to the longitudinal axis;
    (c) a receiver having a surface with a substantially square, planar configuration, said receiver surface being located substantially in a plane perpendicular to said longitudinal axis;
    (d) said receiver surface intersecting said flux concentration and having a corner area positioned outside of said flux concentration; and
    (e) secondary optical reflector means having a reflective surface and adapted for positioning within said flux concentration, said reflector means being adapted to reflect light from said flux concentration to said receiver surface corner area.

11. The system according to claim 10 wherein:
    (a) said receiver includes four corner areas each positioned outside of said flux concentration; and
    (b) said secondary reflector means comprises four pairs of reflector units, each reflector unit pair being associated with a respective pair of receiver corner areas.

12. The system according to claim 10, which includes:
    (a) means for causing said light concentration to have a cross-sectional area substantially equal to an area of said receiver surface where said receiver intersects said light concentration.

13. The system according to claim 11 wherein:
    (a) said cross-sectional area of said light concentration includes four marginal portions each located outside a respective side of said receiver, each said marginal portion having a substantially straight edge along a respective edge of the receiver and a curved edge extending outwardly from a respective receiver edge; and
    (b) each said reflector unit being positioned substantially within a portion of the light concentration directed to a respective said marginal portion.

14. The system according to claim 11 wherein:
    (a) said reflector units of each said reflector unit pair converge in a direction generally towards said concentrator.

15. The system according to claim 10 wherein:

(a) said reflective surface of said reflector means has a proximate end located in proximity to said receiver surface and a distal end spaced therefrom in a direction towards said concentrator;
(b) said reflective surface is wider at said distal end thereof than at said proximate end thereof; and
(c) said reflective surface has a tapered configuration and converges from its distal end to its proximate end.

16. The system according to claim 10 wherein:
(a) said reflective surface of said reflector means comprises anodized aluminum.

17. The reflector according to claim 10 wherein:
(a) said reflective surface of said secondary reflector means comprises silvered glass.

18. The system according to claim 10, which includes means for causing
(a) rays striking said reflective surface of said secondary reflector means to crisscross before striking said receiver surface corner area.

19. The system according to claim 10 wherein:
(a) said reflective surface has a configuration adapted for reflecting rays from said concentrator to said receiver surface corner area through ray traces, whereby said ray traces do not cross each other between said reflective surface and said receiver surface corner area.

20. A solar energy system, which comprises:
(a) a dish-shaped, flexible membrane concentrator having a concave reflective surface and a longitudinal axis;
(b) said concentrator being adapted for an operational orientation with its longitudinal axis extending towards a light source and its concave reflective surface being exposed to said light source;
(c) with said concentrator in its operational orientation being adapted to provide a generally conical flux concentration with a focal point on said longitudinal axis, said flux concentration having a circular image lying in a plane in spaced relation from said focal point and generally perpendicular to said longitudinal axis;
(d) a photovoltaic receiver having a plurality of photovoltaic modules and a substantially square surface with four corners and four sides, said receiver surface being substantially coplanar with said flux concentration image and substantially centered on said longitudinal axis;
(e) said flux concentration image being larger in area than said receiver surface;
(f) said flux concentration image having four marginal portions each located outside of and adjacent to a respective receiver surface side;
(g) said receiver surface having four corner portions each located outside of said flux concentration image;
(h) a reflector assembly including:
  (1) four reflector subassemblies each comprising a pair of reflector elements and associated with a respective receiver surface side;
  (2) each said reflector element having a proximate end located adjacent to a respective receiver surface side and a distal end positioned in spaced relation from said receiver surface towards said collector;
  (3) each said reflector element having a tapered configuration with said distal end being wider than said proximate end;
  (4) each said reflector element pair comprising a reflector subassembly converging from spaced proximate ends to adjacent distal ends;
  (5) each said reflector element having a longitudinally and transversely concave reflective surface; and
(i) said receiver in its operational orientation, said reflector assembly being adapted to deflect portions of said flux concentration directed towards said image marginal portions to said receiver surface corner portions.

* * * * *